United States Patent [19]

Xie

[11] Patent Number: 5,063,569
[45] Date of Patent: Nov. 5, 1991

[54] VERTICAL-CAVITY SURFACE-EMITTING LASER WITH NON-EPITAXIAL MULTILAYERED DIELECTRIC REFLECTORS LOCATED ON BOTH SURFACES

[75] Inventor: Ya-Hong Xie, Flemington, N.J.

[73] Assignee: AT&T Bell Laboratories, Murray Hill, N.J.

[21] Appl. No.: 630,464

[22] Filed: Dec. 19, 1990

[51] Int. Cl.$^5$ .............................................. H01S 3/19
[52] U.S. Cl. .................................. 372/45; 372/46; 372/49; 372/99
[58] Field of Search ................. 372/45, 46, 50, 49, 372/99

[56] References Cited

U.S. PATENT DOCUMENTS

| | | | |
|---|---|---|---|
| 4,752,934 | 6/1988 | Fukuzawa et al. | 372/45 |
| 4,949,350 | 8/1990 | Jewell et al. | 372/96 |

FOREIGN PATENT DOCUMENTS

| | | | |
|---|---|---|---|
| 60-81888 | 7/1985 | Japan . | |
| 0266779 | 10/1989 | Japan | 372/45 |

OTHER PUBLICATIONS

Sakagushi, T. et al., "TiO$_2$ (or Si)/SiO$_2$ Dielectric Multilayer Reflector for Surface Emitting Lasers", *Proc. of MRS Int'l. Mtg on Advanced Materials*, vol. 10, Multilayers, May 31–Jun. 1, 1988.

*Primary Examiner*—Georgia Epps
*Attorney, Agent, or Firm*—David I. Caplan

[57] ABSTRACT

A vertical-cavity surface-emitting semiconductive laser has non-epitaxial multilayered dielectric reflectors located on both its top and its bottom surfaces, in order to facilitate fabrication of the reflectors and achieve high optical cavity gain and low electrical power dissipation.

12 Claims, 1 Drawing Sheet

VERTICAL-CAVITY SURFACE-EMITTING LASER WITH NON-EPITAXIAL MULTILAYERED DIELECTRIC REFLECTORS LOCATED ON BOTH SURFACES

TECHNICAL FIELD

This invention relates to semiconductor lasers and more particularly to those which have vertical optical cavities for the emission of light (optical radiation) through a horizontal surface of the semiconductor. Such laser structures can be referred to as "vertical-cavity, surface-emitting lasers," or more simply as "vertical lasers."

BACKGROUND OF THE INVENTION

In a vertical laser structure, there is an active region in which optical gain occurs, and light is emitted from the top or the bottom (major) surface, or both, of the laser structure. A vertical optical cavity is created in the structure by virtue of semi-reflecting optical reflector(s) located on the top or bottom surface thereof, or both.

The structure of a vertical laser can be made circularly symmetric. Therefore, a vertical laser can have the advantage of relatively low astigmatism as compared with other lasers, such as "edge" lasers in which light is emitted from a side edge of the semiconductor body.

In a Japanese patent No. 60-81888 entitled "Surface Light Emitting Laser and Manufacture Thereof" issued to H. Tanaka on July 9, 1985, a vertical-cavity semiconductor laser was disclosed in which one of the reflectors (on the bottom, non-emitting surface) was a mirror stack (plurality) of alternating in situ epitaxially-grown layers of n-type (or p-type) semiconductive $Al_x Ga_{1-x}As$ and n-type (or p-type) semiconductive $Al_y Ga_{1-y}As$, with y being different from x. The thickness of each layer was selected to be equal to a quarter of the wavelength (measured in the semiconductor) of the central optical wavelength, that is, $\lambda/4n$, where $\lambda$ is the vacuum wavelength of the center of the optical distribution, and n is the refractive index. Because the dielectric constant difference between $Al_x Ga_{1-x}As$ and $Al_y Ga_{1-y}As$ is relatively small regardless of x and y, it requires a relatively large number of such epitaxially-grown layers in the mirror stack to achieve a desirably high overall optical reflectivity for the stack, whereby the optical stop band of the reflector is relatively small and processing time is relatively large.

In a paper entitled "$TiO_2$ (or Si)/$SiO_2$ Dielectric Multilayer Reflector For Surface Emitting Lasers," authored by T. Sakaguchi et al., published in *Processings of the MRS (Materials Research Society) International Meeting on Advanced Materials*, Vol. 10, *Multilayers* (May 31–June 1, 1988), a vertical-cavity semiconductor laser structure was described having a multilayered ex situ (non-epitaxially) deposited quarterwave dielectric reflector composed, for example, of alternating layers of $TiO_2/SiO_2$ (titanium dioxide/silicon dioxide) located on the top (light-emitting) surface of the laser structure. An $Au/SiO_2$ (gold/silicon dioxide) ring/electrode reflector was located on the bottom (non-light-emitting) surface thereof. In that way, the top mirror could have higher reflectivity with shorter processing time and with wider optical stop band. To the extent, however, that that laser structure relies upon metallic reflection at the bottom surface, the structure suffers from undesirable optical loss, as well as from relatively low optical reflectivity thereat, typically below about 97 or 98 per centum, as compared with a desired reflectivity in excess of 99 per centum. And to the extent that that laser relies upon reflection by the silicon dioxide layer on the bottom surface, again the attainable optical reflectivity is less than desired.

Therefore, it would be desirable to have a laser structure which mitigates the foregoing disadvantages.

SUMMARY OF THE INVENTION

The foregoing problems are mitigated in a vertical cavity semiconductor laser structure comprising:

(a) an epitaxially-grown semiconductor top buffer layer (18, 19) having a planar top surface;

(b) an epitaxially-grown semiconductive bottom buffer layer (15, 16) having a planar bottom surface;

(c) an epitaxially-grown semiconductive active layer (17) sandwiched between the buffer layers;

(d) a bottom multilayered dielectric reflector (14) located on the bottom surface of the bottom buffer layer; and (e) a top multilayered dielectric reflector (24) located on the top surface of the top buffer layer, the top and bottom reflectors being non-epitaxial with respect to the top and bottom buffer layers, respectively.

A semiconductive optical cavity is thus formed by the following successive semiconductive epitaxial layers: the top epitaxially-grown semiconductive buffer layer, an optically active region formed by a laterally limited portion of the epitaxially-grown semiconductive active layer, and the bottom epitaxially-grown semiconductive buffer layer. The terms "top" and "bottom" can be interchanged. During operation, typically, the desired light output is emitted through the top reflector.

Typically, each of the reflectors consists essentially of alternating layers of first and second materials having suitably different refractive indices, each layer having a thickness of a quarter-wavelength ("quarterwave layer"). As used herein, the term "non-epitaxial" refers to the situation in which none of the layers in a reflector has been epitaxially grown upon any of the semiconductor layers of the optical cavity, and none of the semiconductor layers of the optical cavity have been epitaxially grown upon any reflector layer. Typically each reflector is made of amorphous materials, so that its fabrication generally is easier and faster. Thus also the materials of the reflectors are not restricted to be crystalline; and even if they are crystalline, they need not be lattice matched to the materials of the optical cavity. Thus, each of the first and second multilayered reflectors can be composed of alternating layers of first and second amorphous materials, whereby speed and ease of fabrication are further enhanced. At the same time, by advantageously using a sufficient number of quarter-wavelength layers for the top (light-emitting) reflector, the optical reflectivity can be made to be at least about 99.0 per centum; and for the bottom (non-light-emitting) reflector, at least about 99.5 per centum, preferably at least about 99.8 or 99.9 per centum. To achieve such a high reflectivity with a $TiO_2/SiO_2$ multilayered quarterwave stack, it requires only about 5 or 6 pairs of such layers.

In addition, the structure of this invention advantageously further comprises a top electrode layer which has a bottom planar surface physically contacting the top planar surface of the top buffer layer at an areal portion thereof that extends laterally for a first distance which is at least about a factor of ten larger than the thickness of the this electrode layer. Similarly, the structure advantageously also comprises a bottom electrode layer which has a top planar surface physically contacting the bottom surface of the bottom buffer layer at an areal portion thereof that extends laterally for a second distance which is at least about a factor of ten larger than the thickness of this bottom electrode layer. In this way, undesirable electrical crowding and resistance effects are avoided.

The top electrode layer advantageously has an aperture into which the top reflector is formed by deposition therein. Thus, a side surface of this reflector contacts a side surface of this electrode at the boundary of the aperture. Similarly, the bottom electrode layer advantageously has an aperture into which the bottom reflector is formed by deposition. Both these depositions are advantageously performed in a deposition chamber which is different from that in which the epitaxial growth of the semiconductive layers is performed.

A heat sink is advantageously affixed to the bottom surface of the bottom electrode layer. Also, advantageously the active layer has an isolation region consisting of an essentially insulating or semi-insulating region for laterally confining electrical current, flowing between the top and bottom electrode layers. This isolation region serves to increase the current density in the remaining, active region of the active layer, and hence to increase the optical gain and reduce the threshold current for laser operation. This isolation region has an edge which is advantageously substantially aligned with an edge of each of the first and second dielectric reflectors, and this edge alignment provides a geometry for the structure which minimizes both optical and electrical power losses. Advantageously, each of the reflectors forms a disk (as viewed from above), so that virtually all of the optical radiation emanating from the semiconductive optical cavity is incident upon the reflectors. Moreover, a two-dimensional array of lasers comprising a plurality of laser structures, each according to the invention, can be integrated on a single electrically conductive heat sink layer, which also supplies mechanical support.

BRIEF DESCRIPTION OF THE DRAWING(S)

This invention, together with its features, advantages, and characteristics, may be better understood from the following detailed description when read in conjunction with the drawings in which FIG. 1 is a side elevational view in cross section of a semiconductor laser structure in accordance with a specific embodiment of the invention; and FIG. 2 is a side elevational view in cross section of the semiconductor laser structure shown in FIG. 1 in an early stage of its fabrication.

DETAILED DESCRIPTION

Figure 1:
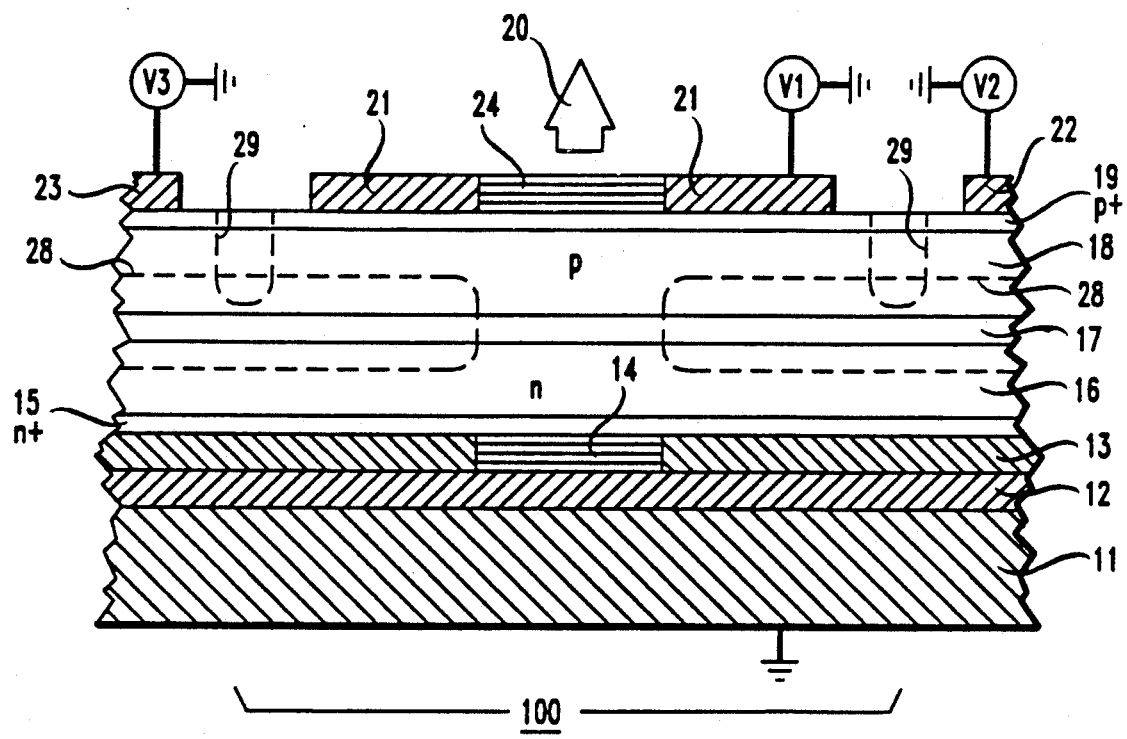

Referring now to the drawings, FIG. 1 shows a laser structure 100 having an output optical beam 20 which varies in accordance with an input voltage source V1 connected to a top electrode layer 21. The structure 100 is integrated upon a thermally and electrically conductive mechanical support 11, which may also serve as a heat sink and which may also support similar neighboring laser structures (not shown) having input voltage sources V2 and V3 connected to top electrode layers 22 and 23, respectively. Typically, the mechanical support layer 11 is made of a metallic alloy having substantially the same thermal expansion coefficient as that of GaAs.

A metallic glue layer 12, typically a gold-tin or a gold-silicon alloy, binds the mechanical support layer 11 to an ohmic contact electrode layer 13 and to a multilayered dielectric reflector 14. The electrode layer 13 and the reflector 14 contact an epitaxial $Al_{0.1}Ga_{0.9}As$ layer 15 having $n^+$-type conductivity. Advantageously, the electrode layer 13 makes ohmic contact with the bottom surface of the $n^+$ layer 15. Upon the top surface of the $n^+$ layer 15 is located an $Al_{0.3}Ga_{0.7}As$ epitaxial layer 16 having n-type electrical conductivity.

Upon the top surface of this layer 16 is located a GaAs active layer 17. Alternatively, the layer 17 is a multiple quantum well layer. At any rate, a central portion of this layer 17 serves as the active region of the laser structure 100; peripheral portions of this layer 17—viz., the portions of layer 17 located within an isolated region 28 of insulating or semi-insulating material, typically of damaged semiconductor material—form part of the isolation region 28.

A p-type conductivity $Al_{0.3}GA_{0.7}As$ epitaxial layer 18 is located on the top surface of the layer 17, and a $p^+$ conductivity $Al_{0.1}Ga_{0.9}As$ epitaxial layer 19 is located on the top surface of this layer 18.

Upon the top surface of the $p^+$ layer 19 is located multilayered dielectric reflector 24. Insulating region 29 electrically isolates the laser structure 100 from neighboring laser structures. Charge-carrier flow between electrodes 13 and 21 is confined by the isolation region 28 to an active (central) region of layer 17 where the optical radiation is generated and amplified. The isolation region 28 also aids in the electrical isolation between neighboring laser structures.

The dielectric reflectors 14 and 24, as viewed from above, typically are in the form of circular disks, whereby they form a circular optical cavity. Each of these reflectors consists essentially of a quarterwave mirror stack, viz., a multiplicity of essentially quarter wavelength layers, typically, alternating layers of titanium dioxide and silicon dioxide, or of titanium nitride and silicon dioxide. Advantageously, the number of layers in the mirror 14 is selected so that its overall reflectivity is at least about 99.5 per centum, and preferably about 99.8 or 99.9 per centum; and the number of layers in the reflector 24 is selected so that its overall reflectivity is preferably in the approximate range of 99.0 to 99.5 per centum. Thus, preferably the number of pairs of layers for the reflector 24 is approximately equal to 4; for the reflector 14, about 5 or 6.

The layers 16 and 18 serve as buffer layers, whereas the layers 15 and 19 provide ohmic contacts with electrode layers 13 and 21, respectively. The relatively high doping levels in the layers 15 and 19 decrease the tunneling barrier widths between the electrode layers 13 and 21, respectively, and the buffer layers 16 and 18, whereby power dissipation is decreased. The chemical compositions of the layers 15 and 19 decrease the respective tunneling barrier heights, thereby further reducing the power dissipation. It should be noted that, in order to reduce bulk series resistance and hence reduce power dissipation, the two layers 18 and 19 can be replaced by a single buffer layer of $Al_{0.3}Ga_{0.7}As$ having $n^+$ conductivity, at some possible sacrifice of undesirable free-carrier absorption of optical radiation and of contact resistance to the electrode layer 21. Similarly, the two layers 15 and 16 can be replaced by a single buffer layer of $Al_{0.3}Ga_{0.7}As$ having $p^+$ conductivity.

Only by way of illustration, the following are thickness and impurity doping concentration parameters for the various semiconductive layers measured in μm and atoms per cubic centimeter, respectively.
Layer 15: 0.02 1 E 19.
Layer 16: 1. 5 E 17.
Layer 17: 0.7 5 E 16.
Layer 18: 1. 1 E 18.
Layer 19: 0.02 5 E 19.

During laser operation, the voltage V1 is applied to the electrode layer 21. As a result, light is generated in the active region of the active layer 17. Certain electromagnetic mode(s) is (are) favored by the cavity and laser action occurs, whereby the desired output laser beam 20 is emitted, typically having a central wavelength of about 0.89 μm.

Figure 2:
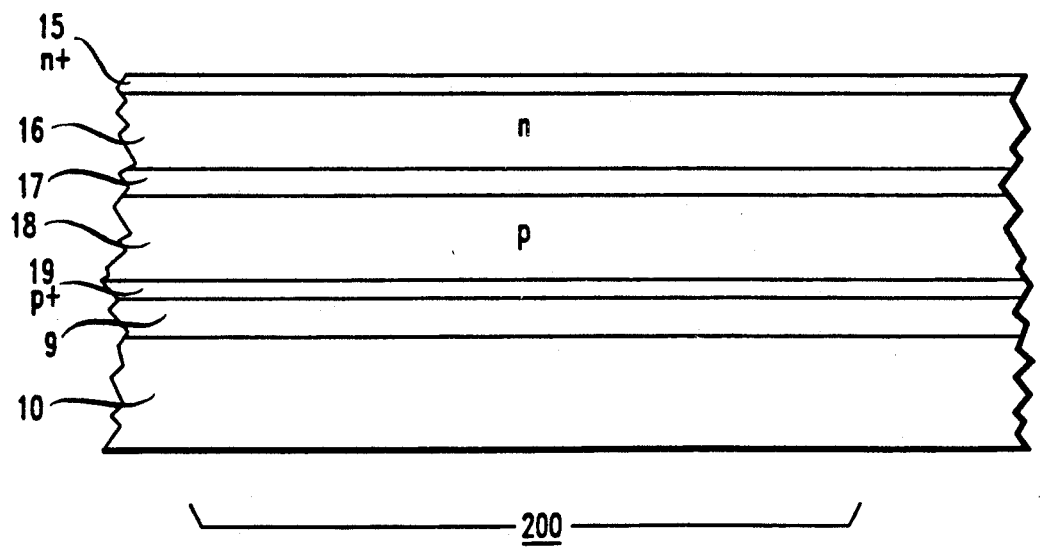

Referring now to FIG. 2, structure 200 depicts an early stage of an advantageous fabrication of the structure 100 (FIG. 1). More specifically, upon a major surface of a GaAs substrate 10, typically having a thickness of 300 μm, is epitaxially grown an AlAs layer 9, followed in succession by epitaxial growth of the above-described layers 19, 18, 17, 16, and 15. Typically, the technique of molecular beam epitaxy is used for these epitaxial growths. The thickness of the AlAs layer 9 is typically about 0.02 μm. It is important that this layer 9 be free from Ga, so that later on (as described below) it can be etched away by an etching solution, such as HF, that attacks only this layer and not the thus epitaxially-grown layers 19, 18, 17, 16, and 15. In this way, the structure 200 is obtained.

Next, oxygen ions or hydrogen ions are implanted through the top surface of the layer 15 except for portions thereof where the reflector 14 is to be located. The depth of this implant extends through layers 16 and 17 into the midst of layer 18 down to a depth corresponding to the location of isolation region 28 (FIG. 1), in order to damage the semiconductive material. Then the structure is subjected to a heat treatment so that the damage is annealed and electrical conductivity is restored at regions near the surface but not in the interior, whereby isolation region 28 is defined where desired (FIG. 1).

Then electrode layer 13 is deposited on the surface of layer 15. This electrode layer 13 is provided with a circular aperture into which the multilayered dielectric reflector 14 is then deposited. Next, the metallic glue layer 12 is formed over the electrode layer 13 and the reflector 14, and the mechanical support layer 11 is affixed to this glue layer 12.

Then, the GaAs substrate 10 is lapped, so that its thickness is greatly reduced, typically to about 50 μm. Next, the AlAs layer 9 is etched away, for example, with an etching solution of HF, whereby the GaAs layer falls away from the remainder of the structure and none of the other layers are attacked by the etching solution.

Next, another oxygen or hydrogen ion implant through the surface of layer 19 is carried out through a suitable patterned mask, whereby isolation region 29 is created. Then top electrode layers 21, 22, 23, . . . are formed with apertures for the deposition therein of the multilayered dielectric reflector 24.

The multilayered dielectric reflectors 14 and 24 are both advantageously fabricated outside the epitaxial growth chamber used for the epitaxial growth of semiconductive layers 9, 19, 18, 17, 16, and 15. In this way, the reflectors can be referred to as "ex situ deposited" or as "ex situ grown", and the layers which form these reflectors advantageously can be amorphous. In any event, the dielectric reflector layers are not epitaxial with respect to the semiconductive layers. In addition, the reflector layers can be patterned, as by a resist lift-off step, so as not to coat the electrode layers.

Although the invention has been described in terms of a specific embodiment, various modifications can be made without departing from the scope of the invention. For example, the cladding layers can be InP in combination with an active layer of (lattice-matched) $In_{0.53}Ga_{0.47}P$. Also, p-type and n-type semiconductive layers can be replaced with n-type and p-type layers, respectively.

I claim:
1. In a vertical-cavity semiconductor laser structure:
   (a) a first epitaxially grown semiconductor buffer layer having a planar top surface;
   (b) a second epitaxially grown semiconductor buffer layer having a planar bottom surface;
   (c) an epitaxially grown semiconductive active layer sandwiched between the first and second buffer layers;
   (d) a first multilayered dielectric reflector located on the top surface of the first buffer layer; and
   (e) a second multilayered dielectric reflector located on the bottom surface of the second buffer layer,
   the first and second reflectors being non-epitaxial with respect to the first and second buffer layers, respectively.

2. The structure of claim 1 in which the first multilayered reflector is composed of alternating amorphous layers of first and second materials.

3. The structure of claim 2 in which the second multilayered reflector is composed of alternating amorphous layers of the first and second materials.

4. The structure of claim 1 further comprising a first electrode layer having a first thickness and having a bottom planar surface physically contacting the top planar surface of the first buffer layer at an areal portion thereof that extends laterally for a first distance which is at least about ten times larger than the thickness of the first electrode layer.

5. The structure of claim 4 in which a side surface of the first electrode layer contacts a side surface of the first dielectric reflector.

6. The structure of claim 4 further comprising a second electrode layer a second thickness having a planar top surface physically contacting the bottom surface of the second buffer layer at an areal portion thereof that extends laterally for a second distance which is at least ten times larger than the thickness of the second electrode layer.

7. The structure of claim 6 in which a side surface of the second electrode physically contacts a side surface of the second dielectric reflector.

8. The structure of claim 6 further comprising a heat sink layer affixed to a bottom surface of the second electrode layer.

9. The structure of claim 7 further comprising an essentially insulating or semi-insulating region for confining electrical current, flowing between the first and second electrodes layers, the insulating or semi-insulating region being located in a portion of the active layer and having an edge which is aligned with an edge of each of the first and second reflectors.

10. The structure of claim 1 in which the first multilayered dielectric reflector consists essentially of a first plurality of quarter wavelength layers sufficient to produce an optical reflectivity of at least about 99.0 per centum.

11. The structure of claim 9 in which the second multilayered dielectric reflector consists essentially of a second plurality of quarter wavelength layers sufficient to produce an optical reflectivity of at least about 99.5 per centum.

12. The structure of claim 11 in which the reflectivity is at least about 99.9 per centum.

* * * * *